US012322957B2

(12) United States Patent
Dellea et al.

(10) Patent No.: US 12,322,957 B2
(45) Date of Patent: Jun. 3, 2025

(54) OUTPUT DRIVER PROVIDED WITH AN ACTIVE OVERVOLTAGE PROTECTION

(71) Applicant: EM Microelectronic-Marin SA, Marin (CH)

(72) Inventors: Mario Dellea, La Chaux-de-Fonds (CH); Athos Canclini, Neuchâtel (CH)

(73) Assignee: EM Microelectronic-Marin SA, Marin (CH)

( * ) Notice: Subject to any disclaimer, the term of this patent is extended or adjusted under 35 U.S.C. 154(b) by 219 days.

(21) Appl. No.: 18/322,184

(22) Filed: May 23, 2023

(65) Prior Publication Data

US 2024/0030901 A1    Jan. 25, 2024

(30) Foreign Application Priority Data

Jul. 25, 2022 (EP) .................................... 22186739

(51) Int. Cl.
*H02H 9/04* (2006.01)
*H10D 89/60* (2025.01)

(52) U.S. Cl.
CPC ............ *H02H 9/046* (2013.01); *H10D 89/60* (2025.01); *H10D 89/819* (2025.01)

(58) Field of Classification Search
CPC ..................... H02H 9/046; H10D 89/60–931
See application file for complete search history.

(56) References Cited

U.S. PATENT DOCUMENTS

| | | | |
|---|---|---|---|
| 2007/0025034 A1* | 2/2007 | Chaudhary | H03K 17/08142 257/E27.112 |
| 2011/0063763 A1* | 3/2011 | Alvarez | H10D 89/817 257/E27.06 |
| 2011/0304940 A1* | 12/2011 | Cao | H01L 23/60 361/56 |
| 2016/0336741 A1* | 11/2016 | Chen | H10D 89/611 |
| 2021/0036513 A1 | 2/2021 | Ikeda | |

OTHER PUBLICATIONS

European Search Report for 22186739 dated Jan. 4, 2023.

* cited by examiner

*Primary Examiner* — Jared Fureman
*Assistant Examiner* — Christopher J Clark
(74) *Attorney, Agent, or Firm* — Sughrue Mion, PLLC

(57) ABSTRACT

An output driver (12), including: a first supply rail (13A) configured to receive a high supply electrical voltage (Vdd); a second supply rail (13B) configured to receive a low supply electrical voltage (Vss); a pad terminal (15) configured to output an output electrical voltage (V_pad_out); an output stage (14) connected to the pad terminal (15) and to the first and second supply rails (13A, 13B). The output stage (14) has an electrical clamping circuit (18A, 18B) including a semiconductor electronic switching component (Q3, Q6) made of a first type of semiconductors and a semiconductor electronic switching component (Q4, Q7) made of a second type of semiconductors. A resistor (R3, R0) is connected between the first or second supply rail and the semiconductor electronic switching component (Q3, Q6) of the first type, at an intermediate terminal (20, 24).

12 Claims, 2 Drawing Sheets

OUTPUT DRIVER PROVIDED WITH AN ACTIVE OVERVOLTAGE PROTECTION

CROSS REFERENCE TO RELATED APPLICATIONS

The present application is based on, and claims priority from the prior European Patent Application No. 22186739.3, filed on Jul. 25, 2022, the entire contents of which are incorporated herein by reference.

TECHNICAL FIELD

The invention relates to an output driver. Such an output driver is typically implemented in an input/output interface provided with a physical layer, the physical layer being said output driver. The output driver is notably (but not limited to) a Universal Serial Bus (USB) driver.

BACKGROUND OF THE INVENTION

In many general purpose input/output interfaces provided with a physical layer such as a Universal Serial Bus (USB) driver, it is required an overvoltage protection.

In the recent Universal Serial Bus specifications, it is defined that the USB ports must be able of withstanding continuous exposure to the waveforms 2 shown in FIG. 1 while in any drive state. These waveforms 2 are applied directly into each USB data pin 4 (shown in FIG. 2) of a USB device 5, from a voltage source 6 with an output impedance 8 of 39Ω. The open-circuit voltage of the source 6 shown in FIG. 2 is based on the expected worst-case overshoot and undershoot. It is to be noted that the signal produced by the voltage source 6 may be distorted when observed at the USB data pin 4 due to input protection devices possibly incorporated in the USB device.

Generally, there are two possibilities to protect the output driver which are: passive protection and active protection. The passive protection requires to add components in order to avoid overvoltage between the terminals of the driver's transistors and to avoid current injection in the positive supply rail. At the minimum a passive protection needs additional components to switch the bulk of the PMOS (or P-channel Metal-Oxide-Semiconductor) driver, to add followers for the PMOS driver and for the NMOS (or N-channel Metal-Oxide-Semiconductor) driver and to control the gates of the MOS drivers and of their followers. However, a drawback of this solution is the complexity and the increase of the area. Indeed for a same resistor Ron a follower in series with each driver transistor will increase the area by a factor of 4. A good example of this can be seen in the paper of Infineon Technologies "High-Voltage-Tolerant I/O Circuit Design for USB 2.0-Compliant Application"; Moon-Jung Kim, et al., IEEE Custom Integrated Circuits Conference, 2007, pp. 491-494.

In this regard, the main advantage of the active protection it's that does not interfere with the design of the output driver. The area is much smaller as there is no need of follower in series with the drivers. The active protection of the output driver seems however to be little used although it presents real advantages. In the paper "High Voltage Protection for USB Transceivers in 45 nm CMOS" IEEE 2011 by Jagdish Chand, Ravi Mehta, Sumantra Seth, Sujoy Chakravarty, a particular solution for an active protection is proposed with reference to FIGS. 2 and 3 of this paper. However, the solution described in this paper is quite complex. One reason is due to the fact that the disclosed system is proposed without using any 3.3 V gate-oxide transistors that match with the supply voltage of an USB driver. But the main disadvantage of the described solution is the use of an differential amplifier which is too slow regarding the alternative current (AC) stress transitions time. A branch thus needs to be added in order to remove from the high supply electrical voltage Vdd the charges injected by the AC stress, waiting for the clamping circuit to react. Furthermore, the amplifier needs to be compensated so as to be stable, which decreases the bandwidth, and hence the time to react. To solve this problem, the compensation circuit is disconnected by a switch when the AC stress starts. The control of this switch needs an additional transitions detector. Moreover, the consumption the system is quite high: 300 µA in active mode and 12 µA in power-down mode. Finally, the system described in this paper is an active protection only for positive overvoltage but not for the negative voltage (of about −1.0 V) of the AC stress.

SUMMARY OF THE INVENTION

The object of the invention is therefore to overcome the drawbacks of the prior art by providing an output driver which includes active protection against overvoltage, and which is simpler and more robust yet stable and efficient, while having a faster time to react, a low consumption and being able to be protected both from positive and negative overvoltage.

According to the invention, there is provided an output driver as recited in claim 1.

The proposed new solution has the advantage that it is simple, robust, stable and efficient, while having a faster time to react. Indeed, when an overvoltage happens at the pad terminal, one of the conduction terminals of the semiconductor electronic switching component of the first type is pull-up which produces an exponential increase of the current in the resistor, and which makes the semiconductor electronic switching component of the second type conducting. The pad terminal is then clamped by the semiconductor electronic switching component of the second type, which is in saturation mode. Furthermore, in normal operation the consumption of the output driver is controlled by the biasing of the semiconductor electronic switching component of the first type and can be very low.

The semiconductor electronic switching components of the first and second types can be any kind of transistors, such as, without limitation, bipolar transistors, Insulated Gate Bipolar Transistors (IGBT), field effect transistors, Metal-Oxide-Semiconductor Field Effect Transistors (MOSFET), Junction Field Effect Transistors (JFET) and so on, or even any kind of triodes or triode tubes.

Preferably, the resistor has a resistance value chosen in such a way that the resulting voltage when an electrical current flows through the resistor is lower than a threshold voltage of the semiconductor electronic switching component of the second type for said current.

Preferably, the semiconductor electronic switching components of the first and second types are Metal-Oxide-Semiconductor Field-Effect Transistors (MOSFET).

According to a preferred embodiment of the invention, the output stage comprises two electrical clamping circuits, a first electrical clamping circuit being connected to the pad terminal and to the first supply rail, a second electrical clamping circuit being connected to the pad terminal and to the second supply rail. Such a configuration allows the output driver to be protected both from positive and negative overvoltage.

According to a particular technical feature of the preferred embodiment of the invention, in the first electrical clamping circuit, the semiconductor electronic switching component of the first type is a N-channel MOSFET and the semiconductor electronic switching component of the second type is a P-channel MOSFET, the drain terminal of the semiconductor electronic switching component of the first type being connected to the intermediate terminal connected to the resistor, the source terminal of the semiconductor electronic switching component of the first type being connected to the pad terminal, the gate terminal of the semiconductor electronic switching component of the first type being biased with a constant voltage whose value is equal to the low supply electrical voltage plus the shift voltage value, the source terminal of the semiconductor electronic switching component of the second type being connected to the first supply rail, the drain terminal of the semiconductor electronic switching component of the second type being connected to the pad terminal, and the resistor is connected between the first supply rail and the intermediate terminal;

and, in the second electrical clamping circuit, the semiconductor electronic switching component of the first type is a P-channel MOSFET and the semiconductor electronic switching component of the second type is a N-channel MOSFET, the drain terminal of the semiconductor electronic switching component of the first type being connected to the intermediate terminal connected to the resistor, the source terminal of the semiconductor electronic switching component of the first type being connected to the pad terminal, the gate terminal of the semiconductor electronic switching component of the first type being biased with a constant voltage whose value is equal to the high supply electrical voltage minus the shift voltage value, the source terminal of the semiconductor electronic switching component of the second type being connected to the second supply rail, the drain terminal of the semiconductor electronic switching component of the second type being connected to the pad terminal, and the resistor is connected between the second supply rail and the intermediate terminal.

Preferably, the resistor has a resistance value of about 100 kΩ.

Preferably, the or each electrical clamping circuit comprises a second resistor connected between the pad terminal and one of the conduction terminals of the semiconductor electronic switching component of the second type. The second resistor contributes to the stability of the protection of the output driver.

According to a particular embodiment of the invention, said intermediate terminal is a first intermediate terminal, the output driver further comprising a second semiconductor electronic switching component of the first type and a second semiconductor electronic switching component of the second type, each of the second semiconductor electronic switching components of the first and second types comprising a control terminal and two conduction terminals, the second semiconductor electronic switching components of the first and second type being connected together by one of their conduction terminals at a second intermediate terminal, said second intermediate terminal being connected to the output stage, one of the second semiconductor electronic switching components of the first and second types being connected by its other conduction terminal to the first supply rail, the other of the second semiconductor electronic switching components of the first and second types being connected by its other conduction terminal to the second supply rail.

According to a particular technical feature of this embodiment of the invention, the or each electrical clamping circuit further comprises a branch connected between said second intermediate terminal and said first or second supply rail, said branch comprising a third semiconductor electronic switching component of the second type and a third resistor, the third semiconductor electronic switching component of the second type being connected by its conduction terminals between the third resistor and said first or second supply rail, the control terminal of the third semiconductor electronic switching component of the second type being connected to said first intermediate terminal, the third resistor being connected between said second intermediate terminal and one of the conduction terminals of the third semiconductor electronic switching component of the second type. Such a branch helps clamping the pad terminal, in conjunction with the semiconductor electronic switching component of the second type. The third resistor contributes to the stability of the protection of the output driver. The current which flows through the third resistor is about twice the current flowing through the second resistor.

According to another particular technical feature of this embodiment of the invention, the output driver further comprises an output resistor, said output resistor being connected between said second intermediate terminal and the pad terminal. The current which flows through the third resistor produces a voltage drop in the output resistance, so that the output of the driver is clamped a few hundred of mV below the voltage of the pad terminal.

Preferably, the output resistor has a resistance value of about 30Ω.

According to a particular application of the invention, the output driver is a Universal Serial Bus driver.

Other aspects of the invention are recited in the dependent claims attached hereto.

BRIEF DESCRIPTION OF THE DRAWINGS

Other features and advantages of the invention will become apparent from the following description of a non-limiting exemplary embodiment, with reference to the appended drawings, in which.

DETAILED DESCRIPTION OF AN EMBODIMENT OF THE INVENTION

Figure 1:
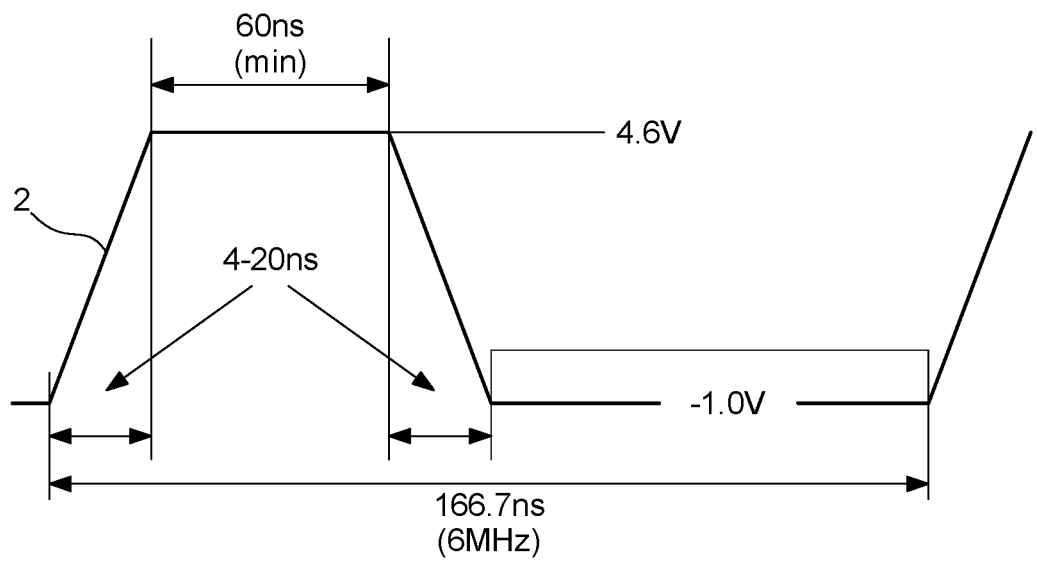
FIG. 1 is a time diagram showing a waveform representative of a normative alternating current stress that an output driver such as an USB port must withstand.
Figure 2:
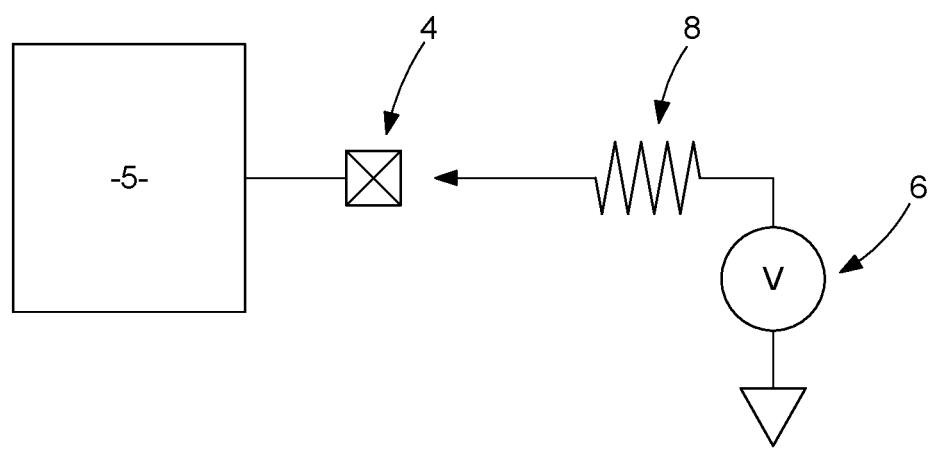
FIG. 2 is a circuit diagram showing a USB driver known from prior art and an equivalent voltage source simulating the normative alternating current of FIG. 1.

An embodiment of the present invention will now be described in detail, with reference to the attached figures. Identical or corresponding functional and structural elements which appear in the different drawings are assigned the same reference numerals.

Figure 3:
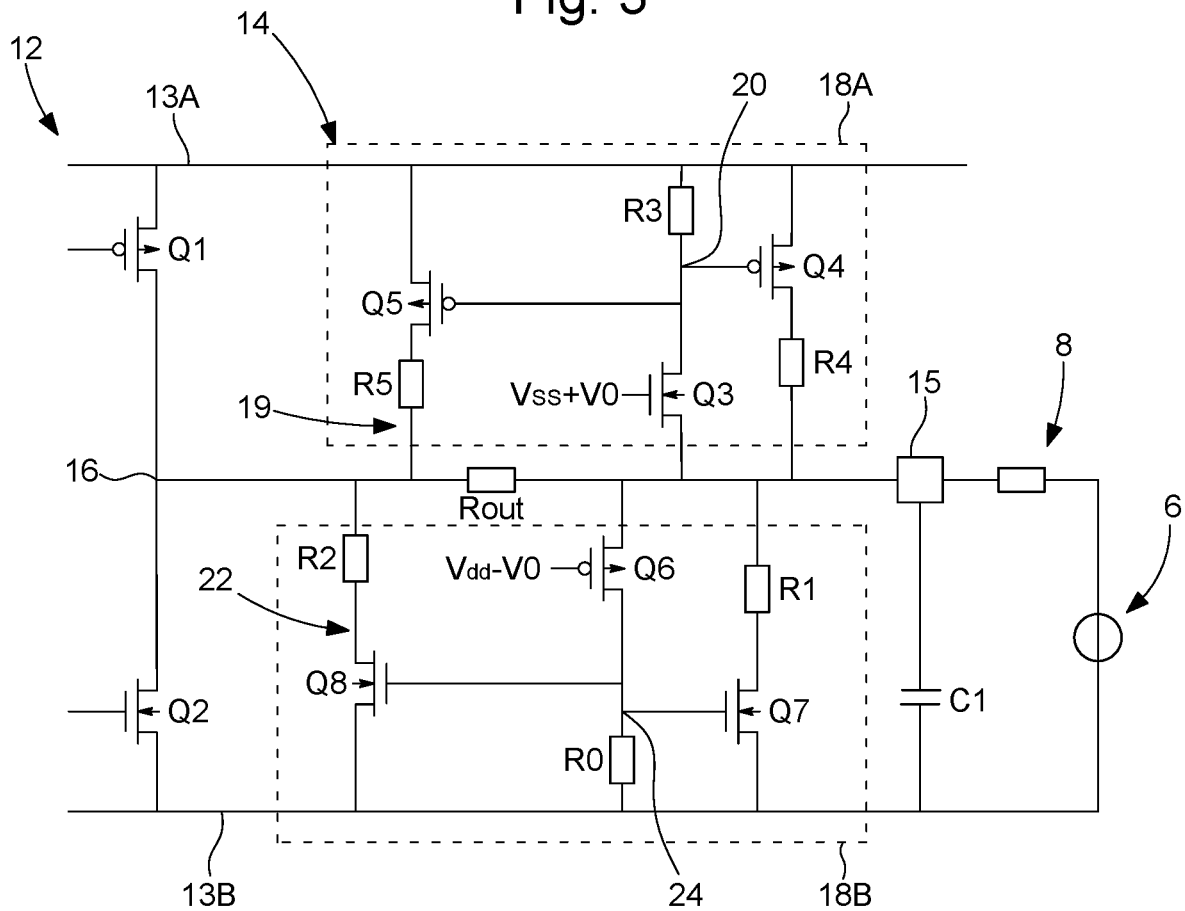
FIG. 3 is a circuit diagram showing an output driver according to a preferred embodiment of the present invention.

FIG. 3 shows in a simplified manner a circuit diagram of an output driver 12 according to a preferred embodiment of the present invention. The output driver 12 is typically a Universal Serial Bus (USB) driver. The output driver 12 comprises a first supply rail 13A, a second supply rail 13B, a pad terminal 15, an output stage 14, a P-channel MOSFET Q1, a N-channel MOSFET Q2 and an output resistor Rout. The drain terminal of the P-channel MOSFET Q1 is connected to the drain of the N-channel MOSFET Q2 at an intermediate terminal 16 (also called a drive terminal). The output resistor Rout is connected between the pad terminal 15 and the intermediate terminal 16. The output resistor Rout typically has a resistance value of about 30Ω.

The first supply rail 13A is configured to receive a high supply electrical voltage Vdd, which is typically a positive electrical voltage. The second supply rail 13B is configured to receive a low supply electrical voltage Vss, which is typically a negative electrical voltage.

The pad terminal 15, which is the terminal intended to be connected to a device or peripheral external to the output driver 12, is configured to output an output electrical voltage V_pad_out. The output electrical voltage V_pad_out is typically comprised between the low supply electrical voltage Vss and the high supply electrical voltage Vdd. The output driver 12 must be able of withstanding continuous exposure to the waveform 2 shown in FIG. 1 while in any drive state. Therefore, in order to model the alternative current (AC) stress transitions time represented by this waveform 2, an equivalent voltage source 6 (of about 4.6 V at maximum and −1.0 V at minimum) has been placed in FIGS. 3 and 4. Everything happens as if the voltage source 6 is connected to the pad terminal 15 (through an output impedance 8 of about 39Ω) on the one hand, and to the second supply rail 13B on the other hand. Besides, a capacitor C1, which represents the load at the output of the output driver 12, is connected between the pad terminal 15 and the second supply rail 13B.

The output stage 14 is connected to the pad terminal 15, to the first and second supply rails 13A, 13B, and to the intermediate terminal 16. The output 14 comprises two electrical clamping circuits 18A, 18B: a first electrical clamping circuit 18A is connected to the pad terminal 15, to the first supply rail 13A, and to the intermediate terminal 16; and a second electrical clamping circuit 18B is connected to the pad terminal 15, to the second supply rail 13B and to the intermediate terminal 16.

The first clamping circuit 18A comprises a N-channel MOSFET Q3, a first P-channel MOSFET Q4, a first resistor R3, a second resistor R4 and a branch 19 comprising a second P-channel MOSFET Q5 and a third resistor R5. The first clamping circuit 18A aims at protecting the output driver 12 from negative overvoltage.

The source terminal of the N-channel MOSFET Q3 is connected to the pad terminal 15, and the drain terminal of the N-channel MOSFET Q3 is connected to the first resistor R3 at an intermediate terminal 20. The gate terminal of the N-channel MOSFET Q3 is biased with a constant voltage whose value is equal to the low supply electrical voltage Vss plus a shift voltage value V0. The shift voltage value V0 is typically comprised between 100 mV and 200 mV.

The source terminal of the first P-channel MOSFET Q4 is connected to the first supply rail 13A, and the drain terminal of the first P-channel MOSFET Q4 is connected to the second resistor R4. The gate terminal of the first P-channel MOSFET Q4 is connected to the intermediate terminal 20.

The first resistor R3 is connected between the drain terminal of the N-channel MOSFET Q3 and the first supply rail 13A. The first resistor R3 has a resistance value chosen in such a way that the resulting voltage when an electrical current flows through the first resistor R3 is lower than a threshold voltage of each of the first and second P-channel MOSFETs Q4, Q5, for said current. The first resistor R3 typically has a resistance value of about 100 kΩ. The second resistor R4 is connected between the drain terminal of the first P-channel MOSFET Q4 and the pad terminal 15.

The branch 19 is connected between the intermediate terminal 16 and the first supply rail 13A. More precisely, the drain terminal of the second P-channel MOSFET Q5 is connected to the first supply rail 13A, and the source terminal of the second P-channel MOSFET Q5 is connected to the third resistor R5. The gate terminal of the second P-channel MOSFET Q5 is connected to the intermediate terminal 20. The third resistor R5 is connected between the intermediate terminal 16 and the source terminal of the second P-channel MOSFET Q5.

Figure 4:
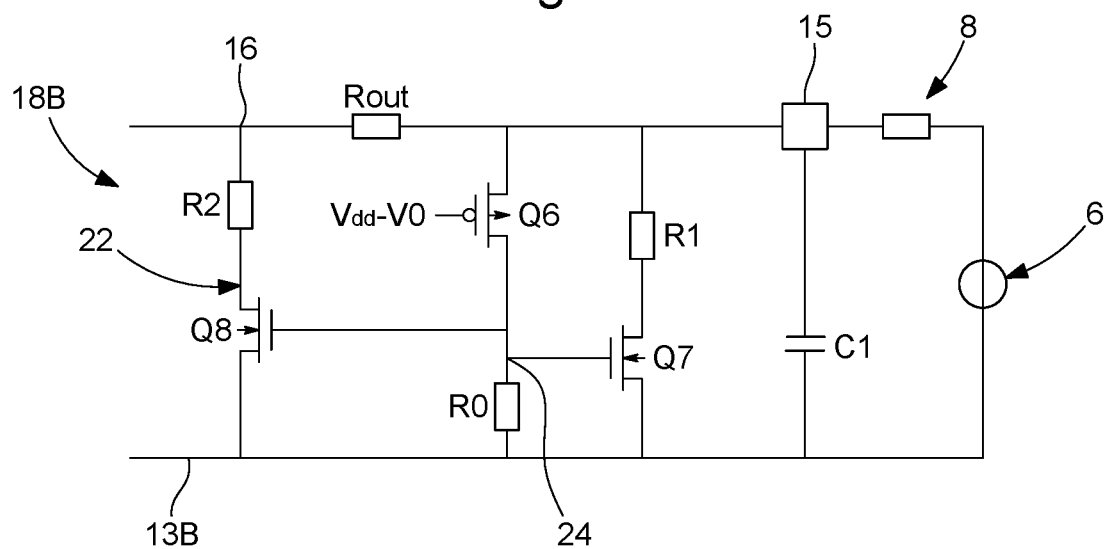
FIG. 4 is a circuit diagram showing a subset of the output driver shown in FIG. 1.

As shown in FIGS. 3 and 4, the second clamping circuit 18B comprises a P-channel MOSFET Q6, a first N-channel MOSFET Q7, a first resistor R0, a second resistor R1 and a branch 22 comprising a second N-channel MOSFET Q8 and a third resistor R2. The second clamping circuit 18B aims at protecting the output driver 12 from positive overvoltage.

The source terminal of the P-channel MOSFET Q6 is connected to the pad terminal 15, and the drain terminal of the P-channel MOSFET Q6 is connected to the first resistor R0 at an intermediate terminal 24. The gate terminal of the P-channel MOSFET Q6 is biased with a constant voltage whose value is equal to the high supply electrical voltage Vdd minus the shift voltage value V0. The shift voltage value V0 is typically comprised between 100 mV and 200 mV.

The source terminal of the first N-channel MOSFET Q7 is connected to the second supply rail 13B, and the drain terminal of the first N-channel MOSFET Q7 is connected to the second resistor R1. The gate terminal of the first N-channel MOSFET Q7 is connected to the intermediate terminal 24.

The first resistor R0 is connected between the drain terminal of the P-channel MOSFET Q6 and the second supply rail 13B. The first resistor R0 has a resistance value chosen in such a way that the resulting voltage when an electrical current flows through the first resistor R0 is lower than a threshold voltage of each of the first and second N-channel MOSFETs Q7, Q8, for said current. The first resistor R0 typically has a resistance value of about 100 kΩ. The second resistor R1 is connected between the drain terminal of the first N-channel MOSFET Q7 and the pad terminal 15.

The branch 22 is connected between the intermediate terminal 16 and the second supply rail 13B. More precisely, the drain terminal of the second N-channel MOSFET Q8 is connected to the second supply rail 13B, and the source terminal of the second N-channel MOSFET Q8 is connected to the third resistor R2. The gate terminal of the second N-channel MOSFET Q8 is connected to the intermediate terminal 24. The third resistor R2 is connected between the intermediate terminal 16 and the source terminal of the second N-channel MOSFET Q8.

The source terminal of the P-channel MOSFET Q1 is connected to the first supply rail 13A. The source terminal of the N-channel MOSFET Q2 is connected to the second supply rail 13B.

The operation of the output driver 12 according to the invention will now be described. In normal operation (i.e. when there is no AC stress), the gate terminal of the N-channel MOSFET Q3 in the first clamping circuit 18A and the gate terminal of the P-channel MOSFET Q6 in the second clamping circuit 18B are biased so these MOSFETs Q3, Q6 are in saturation with a very low drain current. When an overvoltage happens at the pad terminal 15, the source terminal of the N-channel MOSFET Q3 (or the source terminal of the P-channel MOSFET Q6 depending on whether the overvoltage is negative or positive) is pull-up which produces an exponential increase of the current in the first resistor R3 (or R0), and which makes each one of the pair of P-channel MOSFETs Q4, Q5 (or each one of the pair of N-channel MOSFETs Q7, Q8) conducting. The pad terminal 15 is then clamped by the first P-channel MOSFET Q4 through the second resistor R4 and by the second P-channel MOSFET Q5 through the third resistor R5 and the output resistor Rout (or by the first N-channel MOSFET Q7 through the second resistor R1 and by the second N-channel MOSFET Q8 through the third resistor R2 and the output resistor Rout), which are in saturation mode. The current which flows through the third resistor R5 (or through the third resistor R2) is then about twice the current which flows through the second resistor R4 (or through the second resistor R1). The current which flows through the third resistor R5 (or through the third resistor R2) produces a voltage drop in the output resistor Rout, so the output of the output driver 12 is clamped a few hundred of mV below the pad voltage. The sum of the current which flows through the third resistor R5 (or through the third resistor R2) and the current which flows through the second resistor R4 (or through the second resistor R1) drives the current which flows through the output impedance 8 of the AC stress voltage source 6. The second and the third resistors R1, R2, R4, R5 contribute to the stability of the output driver 12 and are used in particular during phases of clamping closed loops of the first and the second clamping circuits 18A, 18B.

Furthermore, in normal operation the consumption of the output driver 12 is controlled by the biasing of the N-channel MOSFET Q3 and of the P-channel MOSFET Q6 and is very low.

While the invention has been illustrated and described in detail in the drawings and foregoing description, such illustration and description are to be considered illustrative or exemplary and not restrictive, the invention being not limited to the disclosed embodiment. Other embodiments and variants are understood, and can be achieved by those skilled in the art when carrying out the claimed invention, based on a study of the drawings, the disclosure and the appended claims.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

What is claimed is:

1. An output driver comprising:
    a first supply rail configured to receive a high supply electrical voltage;
    a second supply rail configured to receive a low supply electrical voltage;
    a pad terminal configured to output an output electrical voltage;
    an output stage connected to the pad terminal and to the first and second supply rails;
    wherein the output stage comprises an electrical clamping circuit, the electrical clamping circuit being connected to the pad terminal and to one of the first and second supply rails, the electrical clamping circuit comprising:
        a semiconductor electronic switching component of a first type and comprising a control terminal and two conduction terminals, said semiconductor electronic switching component of the first type being connected by its conduction terminals between the pad terminal and said first or second supply rail;
        a semiconductor electronic switching component of a second type and comprising a control terminal and two conduction terminals, said semiconductor electronic switching component of the second type being connected by its conduction terminals between the pad terminal and said first or second supply rail;
        a resistor connected between said first or second supply rail on the one hand, and one of the conduction terminals of the semiconductor electronic switching component of the first type, at an intermediate terminal, on the other hand;
    the control terminal of the semiconductor electronic switching component of the first type being biased with a constant voltage whose value is equal to the low supply electrical voltage plus a shift voltage value or to the high supply electrical voltage minus the shift voltage value; the control terminal of the semiconductor electronic switching component of the second type being connected to said intermediate terminal.

2. The output driver according to claim 1, wherein the resistor has a resistance value chosen in such a way that the resulting voltage when an electrical current flows through the resistor is lower than a threshold voltage of the semiconductor electronic switching component of the second type for said current.

3. The output driver according to claim 1, wherein the semiconductor electronic switching components of the first and second types are Metal-Oxide-Semiconductor Field-Effect Transistors.

4. The output driver according to claim 1, wherein the output stage comprises two electrical clamping circuits, a first electrical clamping circuit being connected to the pad terminal and to the first supply, a second electrical clamping circuit being connected to the pad terminal and to the second supply rail.

5. The output driver according to claim 4, wherein, in the first electrical clamping circuit, the semiconductor electronic switching component of the first type is a N-channel MOSFET and the semiconductor electronic switching component of the second type is a P-channel MOSFET, the drain terminal of the semiconductor electronic switching component of the first type being connected to the intermediate terminal connected to the resistor, the source terminal of the semiconductor electronic switching component of the first type being connected to the pad terminal, the gate terminal of the semiconductor electronic switching component of the first type being biased with a constant voltage whose value is equal to the low supply electrical voltage plus the shift voltage value, the source terminal of the semiconductor electronic switching component of the second type being connected to the first supply rail, the drain terminal of the semiconductor electronic switching component of the second type being connected to the pad terminal, and the resistor is connected between the first supply rail and the intermediate terminal; and wherein, in the second electrical clamping circuit, the semiconductor electronic switching component of the first type is a P-channel MOSFET and the semiconductor electronic switching component of the second type is a N-channel MOSFET, the drain terminal of the semiconductor electronic switching component of the first type being connected to the intermediate terminal connected to the resistor, the source terminal of the semiconductor electronic switching component of the first type being connected to the pad terminal, the gate terminal of the semiconductor electronic switching component of the first type being biased with a constant voltage whose value is equal to the high supply electrical voltage minus the shift voltage value, the source terminal of the semiconductor electronic switching component of the second type being connected to the second supply rail, the drain terminal of the semiconductor electronic switching component of the second type being connected to the pad terminal, and the resistor is connected between the second supply rail and the intermediate terminal.

6. The output driver according to claim 1, wherein the resistor has a resistance value of about 100 kΩ.

7. The output driver according to claim 1, wherein the electrical clamping circuit comprises a second resistor connected between the pad terminal and one of the conduction terminals of the semiconductor electronic switching component of the second type.

8. The output driver according to claim 1, wherein said intermediate terminal is a first intermediate terminal, the output driver further comprising a second semiconductor electronic switching component of the first type and a second semiconductor electronic switching component of the second type, each of the second semiconductor electronic switching components of the first and second type comprising a control terminal and two conduction terminals, the second semiconductor electronic switching components of the first and second type being connected together by one of their conduction terminals at a second intermediate terminal, said second intermediate terminal being connected to the output stage, one of the second semiconductor electronic switching components of the first and second type being connected by its other conduction terminal to the first supply rail, the other of the second semiconductor electronic switching components of the first and second type being connected by its other conduction terminal to the second supply rail.

9. The output driver according to claim 8, wherein the electrical clamping circuit further comprises a branch connected between said second intermediate terminal and said first or second supply rail, said branch comprising a third semiconductor electronic switching component of the second type and a third resistor, the third semiconductor electronic switching component of the second type being connected by its conduction terminals between the third resistor and said first or second supply rail, the control terminal of the third semiconductor electronic switching component of the second type being connected to said first intermediate terminal, the third resistor being connected between said second intermediate terminal and one of the conduction terminals of the third semiconductor electronic switching component of the second type.

10. The output driver according to claim 8, wherein the output driver further comprises an output resistor, said output resistor being connected between said second intermediate terminal and the pad terminal.

11. The output driver according to claim 10, wherein the output resistor has a resistance value of about 30Ω.

12. The output driver according to claim 1, wherein the output driver is a Universal Serial Bus driver.

* * * * *